United States Patent
Fujita et al.

(10) Patent No.: US 8,125,595 B2
(45) Date of Patent: Feb. 28, 2012

(54) METAL MATERIAL AND ITS MANUFACTURING METHOD, THIN-FILM DEVICE AND ITS MANUFACTURING METHOD, ELEMENT-SIDE SUBSTRATE AND ITS MANUFACTURING METHOD, AND LIQUID CRYSTAL DISPLAY AND ITS MANUFACTURING METHOD

(75) Inventors: Tetsuo Fujita, Mie (JP); Masafumi Kokura, Tottori (JP); Mitsunori Harada, Mie (JP); Hijiri Nakahara, Mie (JP); Yoshiharu Kataoka, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 749 days.

(21) Appl. No.: 11/908,043

(22) PCT Filed: Feb. 23, 2006

(86) PCT No.: PCT/JP2006/303332
§ 371 (c)(1),
(2), (4) Date: Dec. 9, 2008

(87) PCT Pub. No.: WO2006/095577
PCT Pub. Date: Sep. 14, 2006

(65) Prior Publication Data
US 2010/0033670 A1 Feb. 11, 2010

(30) Foreign Application Priority Data

Mar. 8, 2005 (JP) .................... 2005-064605

(51) Int. Cl.
*G02F 1/1343* (2006.01)
(52) U.S. Cl. ....................... 349/113; 349/114
(58) Field of Classification Search .............. None
See application file for complete search history.

(56) References Cited

U.S. PATENT DOCUMENTS
5,764,324 A * 6/1998 Lu et al. .................. 349/113
(Continued)

FOREIGN PATENT DOCUMENTS
JP 2004-139981 5/2004
(Continued)

OTHER PUBLICATIONS
International Search Report for International Application No. PCT/JP2006/303332 mailed May 16, 2006.

*Primary Examiner* — Mike Stahl
(74) *Attorney, Agent, or Firm* — Nixon & Vanderhye P.C.

(57) ABSTRACT

A difference of work functions in different metal thin films is suppressed without causing the increase of the manufacturing steps or the decrease of the optical performance. In a semi-transmissive reflective liquid crystal display apparatus 1 including a reflective electrode 62 and a transmissive electrode 63 in the pixel electrode 64, the surface of the reflective electrode 62 is subject to a plasma treatment, so that the work function of the reflective electrode 62 is controlled by changing by a value of 0.1 eV from the original value. Thus, it is possible to place the work function of the reflective electrode 62 within a difference of ±0.2 eV with respect to the work function of the transmissive electrode 63. As a result, a number of the manufacturing steps is not increased or no optical performance is decreased, unlike conventional liquid crystal display apparatuses. Even if the optimum direct current offset voltage is applied to one of the reflective electrode 62 and the transmissive electrode 63, it is possible to reduce the deterioration of an image display quality resulting from the difference with the optimum direct current offset voltage for the other electrode. As such, it is possible to improve the display quality of the liquid crystal display apparatus 1.

12 Claims, 5 Drawing Sheets

U.S. PATENT DOCUMENTS

| | | | |
|---|---|---|---|
| 6,888,583 B2 * | 5/2005 | Ilcisin et al. | 349/33 |
| 6,995,821 B1 * | 2/2006 | Lu et al. | 349/113 |
| 2004/0189186 A1 * | 9/2004 | Mori et al. | 313/503 |
| 2006/0267120 A1 * | 11/2006 | Nakahori et al. | 257/414 |

FOREIGN PATENT DOCUMENTS

| | | |
|---|---|---|
| JP | 2005-49817 | 2/2005 |
| JP | 2005-70590 | 3/2005 |

* cited by examiner

METAL MATERIAL AND ITS MANUFACTURING METHOD, THIN-FILM DEVICE AND ITS MANUFACTURING METHOD, ELEMENT-SIDE SUBSTRATE AND ITS MANUFACTURING METHOD, AND LIQUID CRYSTAL DISPLAY AND ITS MANUFACTURING METHOD

This application is the U.S. national phase of International Application No. PCT/JP2006/303332, filed 23 Feb. 2006 which designated the U.S. and claims priority to Japanese Patent Application No. 2005-064605, filed 8 Mar. 2005, the entire contents of each of which are hereby incorporated by reference.

TECHNICAL FIELD

The present invention relates to: a metal material and a method for manufacturing the metal material; a thin-film device using the metal material for a metal thin film material and a method for manufacturing the thin-film device; an element-side substrate including a reflective section for producing a reflective display using surrounding light as an illumination, the reflective section including the metal material for a reflective metal electrode, and a transmissive section for producing a transmissive display using backlight as an illumination in one pixel and a method for manufacturing the element-side substrate; and a semi-transmissive reflective liquid crystal display apparatus using the element-side substrate and a method for manufacturing the semi-transmissive reflective liquid crystal display apparatus.

BACKGROUND ART

A conventional liquid crystal display apparatus is used for a display section of an electronic information device, such as a cell phone, a personal digital assistance (PDA), a laptop personal computer and the like. This liquid crystal display apparatus includes a liquid crystal display panel in which a liquid crystal layer is interposed between a pair of substrates. A display voltage is applied to electrodes provided on both substrates so as to change an orientation state of liquid crystal molecules in the liquid crystal layer, thereby scattering/passing the light. As a result, a character/figure is displayed.

Unlike cathode ray tube (CRT) and electroluminescence (EL) display panels, the liquid crystal display panel does not emit light by itself. Therefore, a transmissive liquid crystal display apparatus is commonly used in which a light transmissive material is used for a pixel electrode. The transmissive liquid crystal display apparatus controls a transmissive amount of light from a backlight, which is provided on the back side of a liquid crystal display panel, using the liquid crystal panel so as to produce an image display.

However, in a conventional transmissive liquid crystal display apparatus, the backlight usually occupies 50% or more of the total power consumption of the liquid crystal display apparatus. Thus, there is a problem that providing a backlight increases power consumption. In addition, in the transmissive liquid crystal display apparatus, when surrounding light is extremely bright, display light looks darker than the surrounding light, thus causing a problem of making it difficult to recognize the display.

As such, in a portable electronic information device which is always carried, for example, outside and used in many occasions, a reflective liquid crystal display apparatus is used in which a reflective light is provided instead of the backlight or a light reflective material is used for a pixel electrode. The reflective liquid crystal display apparatus reflects the surrounding light from the front side of a liquid crystal display panel using the light reflective material so as to produce a display.

However, in a conventional reflective liquid crystal display apparatus, since the reflective light of the surrounding light is used, a problem is caused of extremely reducing the visibility when the amount of the surrounding light is small. In addition, in the reflective liquid crystal display apparatus, the display is produced utilizing the surrounding light for the purpose of reducing the power consumption. Therefore, even in an environment in which power can be sufficiently supplied, if the surrounding light is darker than a predetermined limit value, a problem is caused in that the display cannot be recognized.

As such, recently, a semi-transmissive reflective liquid crystal display apparatus having a transmissive section and a reflective section provided in one pixel has been used, which can produce both a transmissive display and a reflective display.

A conventional semi-transmissive reflective liquid crystal display apparatus includes a liquid crystal display panel having a liquid crystal enclosed between an element-side substrate and an opposing-side substrate, wherein a plurality of pixel electrodes arranged in a matrix and switching elements, such as thin film transistors (TFT) for selectively driving the pixel electrodes, are provided on the element-side substrate, and a plurality of opposing electrodes opposing the plurality of pixel electrodes are provided on the opposing-side substrate. The pixel electrode includes a reflective electrode for reflecting the surrounding light and a transmissive electrode for passing the light from a backlight. The surrounding light is reflected by the reflective electrode and then irradiated onto a liquid crystal layer, and also, the light emitted from the backlight is transmitted through the transmissive electrode and then irradiated onto the liquid crystal layer.

However, in the conventional semi-transmissive reflective liquid crystal display apparatus, the trans missive electrode and the reflective electrode are made of different metal materials, and thus the electrical properties for the respective electrodes are different from each other. As such, the optimum value of a direct current offset voltage (optimum opposing voltage) which is applied to offset a bias electric field generated inside the liquid crystal is different in the transmissive electrode and the reflective electrode.

Therefore, when the optimum direct current offset voltage is applied to one of the transmissive electrode and the reflective electrode, a problem is caused of deteriorating the display quality due to a display flicker, resulting from a difference with the optimum direct current offset voltage for the other electrode. In addition, applying a direct current voltage component for a long time causes a problem of deteriorating the reliability of the liquid crystal.

These problems are considered to result from the fact that the difference of the work functions in the transmissive electrode and the reflective electrode is large (0.4 eV) since the value of the work function of a transparent metal oxide, such as Indium Tin Oxide (ITO), used for a material of the transmissive electrode is about 4.7 eV to 5.2 eV and the value of the work function of a metal material, such as aluminum (Al), used for a material of the reflective electrode is about 4.2 eV to 4.3 eV.

For example, Reference 1 discloses a semi-transmissive reflective liquid crystal display apparatus, in which a transparent electrode material layer having the same work function as that of an opposing electrode is formed on a reflective electrode, made of aluminum, via an insulation layer, and the transparent electrode material layer is also formed as a transparent electrode in a transmissive region.

In addition, Reference 2 and Reference 3 disclose a reflective liquid crystal display apparatus in which a transparent electrode material layer having the same work function as that of an opposing electrode is formed on a reflective electrode.

According to these conventional techniques, by forming the transparent electrode material layer having the same work function as that of the opposing electrode on the reflective electrode, it is possible to eliminate the difference of the optimum values of the direct current offset voltages resulting from the difference with the work function of the opposing electrode and also possible to prevent the deterioration of the display quality and the deterioration of the reliability of the liquid crystal.

[Reference 1] Japanese Laid-Open Publication No. 2003-255375 (page 3 to page 5)

[Reference 2] Japanese Laid-Open Publication No. 10-206845

[Reference 3] Japanese Laid-Open Publication No. 2002-365664

DISCLOSURE OF THE INVENTION

However, in the conventional techniques described above, the transparent electrode material layer having the same work function as that of the opposing electrode is formed on the reflective electrode via the insulation layer. Therefore, a problem of increasing the number of the manufacturing steps occurs. In addition, since a film is laminated on the reflective electrode, a problem of deteriorating the optical performance of the liquid crystal display apparatus occurs.

The present invention is intended to solve the conventional problems described above. The objective of the present invention is to provide: a metal material having the work function thereof controlled by changing by at least a predetermined value and a method for manufacturing the metal material; a thin-film device capable of eliminating or reducing the difference of the work functions in different metal thin films using the metal material and a method for manufacturing the thin-film device; an element-side substrate capable of obtaining an excellent image quality without causing the increase of the manufacturing steps or the deterioration of the optical performance using the thin-film device and a method for manufacturing the element-side substrate; and a semi-transmissive reflective liquid crystal display apparatus using the element-side substrate and a method for manufacturing the semi-transmissive reflective liquid crystal display apparatus.

An electrode material according to the present invention having a work function thereof is controlled by changing by at least a predetermined value by a plasma treatment, thereby the objective described above being achieved.

A method for manufacturing an electrode material according to the present invention having a work function thereof is controlled by changing by at least a predetermined value by a plasma treatment, thereby the objective described above being achieved.

Preferably, the plasma treatment in a method for manufacturing an electrode material according to the present invention is performed using a fluorine-based gas.

Still preferably, the predetermined value in a method for manufacturing an electrode material according to the present invention is 0.1 eV, and a value of the work function is controlled to be within a range of 0.1 eV or more and 1 eV or less.

Still preferably, the predetermined value is 0.1 eV, and a value of the work function is controlled to be within a range of 0.1 eV or more and 0.6 eV or less in a method for manufacturing an electrode material according to the present invention.

Still preferably, the plasma treatment in a method for manufacturing an electrode material according to the present invention is performed on the metal material made of aluminum or a material including the aluminum so as to change a value of the work function of the metal material.

A thin-film device according to the present invention is provided, wherein at least two types of metal films are provided so as to be adjacent to each other, and a work function of at least one of the two types of the metal films is controlled by changing by at least a predetermined value by a plasma treatment so that work functions of the two types of the metal films are changed to be the same or that the difference thereof is reduced, thereby the objective described above being achieved.

Preferably, in a thin-film device according to the present invention, one of the two types of the metal films is provided on a portion or entirety of an other of the two types of the metal films via an insulation film, a portion of the one of the two types of the metal films is connected to the other of the two types of the metal films, and regions of the two types of the metal films are adjacent to each other in a plane view.

Preferably, the one of the two types of the metal films in a thin-film device according to the present invention is made of aluminum or a material including the aluminum, and the other of the two types of the metal films is made of indium oxide, zinc oxide, tin oxide, indium tin oxide or indium zinc oxide.

A method for manufacturing a thin-film device according to the present invention is provided, the method including the steps of: forming an other metal film; forming one metal film; and performing a plasma treatment on the one metal film so that a work function of the one metal film and a work function of the other metal film are controlled to be the same or that the difference thereof is reduced, thereby the objective described above being achieved.

Preferably, in method for manufacturing a thin-film device according to the present invention, the step of forming one metal film forms the one metal film such that a portion of the one metal film is connected to the other metal film on a portion or entirety of the other metal film via an insulation film and a region of the other metal film and a region of the one metal film are adjacent to each other in a plane view.

Preferably, the plasma treatment in method for manufacturing a thin-film device according to the present invention is performed using a fluorine-based gas.

Still preferably, the one metal film in method for manufacturing a thin-film device according to the present invention is made of aluminum or a material including the aluminum, and the other metal film is made of indium oxide, zinc oxide, tin oxide, indium tin oxide or indium zinc oxide.

Still preferably, the predetermined value in method for manufacturing a thin-film device according to the present invention is 0.1 eV, and a value of the work function is controlled to be within a range of 0.1 eV or more and 1 eV or less.

Still preferably, the predetermined value in method for manufacturing a thin-film device according to the present invention is 0.1 eV, and a value of the work function is controlled to be within a range of 0.1 eV or more and 0.6 eV or less.

An element-side substrate according to the present invention is provided having a plurality of pixel electrodes arranged in two dimensions thereon, each of the pixel electrodes including a reflective electrode for reflecting light and a transmissive electrode for passing the light, the reflective electrode is one metal film of the thin-film device according to the present invention, and the transmissive electrode is another metal film of the thin-film device, thereby the objective described above being achieved.

Preferably, a work function of the reflective electrode in an element-side substrate according to the present invention and a work function of the transmissive electrode are controlled to be within a difference of ±0.2 eV.

Still preferably, the reflective electrode in an element-side substrate according to the present invention is made of a laminated layer film, and an upper layer of the laminated film is made of aluminum or a metal material including the aluminum.

Still preferably, a lower layer of the reflective electrode in an element-side substrate according to the present invention is made of a metal layer having a high melting temperature.

Still preferably, a lower layer of the reflective electrode in an element-side substrate according to the present invention is made of an electrical corrosion prevention film.

A liquid crystal display apparatus according to the present invention is provided, wherein the element-side substrate according to the present invention and an opposing-side substrate are arranged at a predetermined interval so as to oppose each other, the opposing-side substrate includes an opposing electrode formed thereon so as to oppose the pixel electrode, and a liquid crystal is enclosed in a gap between the substrates, thereby the objective described above being achieved.

A method for manufacturing an element-side substrate according to the present invention is provided, the element-side substrate having a plurality of pixel electrodes and switching elements for selectively driving the pixel electrodes arranged thereon in two dimensions, the pixel electrode including a reflective electrode for reflecting light and a transmissive electrode for passing the light, the method including: a switching element forming step of forming the switching element on a substrate; a step of forming an insulation film on the switching element formed at the time of the switching element forming step and the transmissive electrode connected to a drain electrode of the switching element; a reflective electrode forming step of forming the reflective electrode on the insulation film; and a plasma treatment step of controlling a work function of the reflective electrode by changing by at least a predetermined value of by performing a plasma treatment on the reflective electrode, thereby the objective described above being achieved.

Preferably, the switching element forming step in a method for manufacturing an element-side substrate according to the present invention includes the steps of: forming a gate wiring and a gate electrode branched therefrom on the substrate; forming a gate insulation film on the gate electrode; forming a semiconductor layer on the gate insulation film so as to correspond to the gate electrode; and forming a source electrode and a drain electrode with a gap therebetween on the semiconductor layer, and forming the transmissive electrode, wherein the semiconductor layer becomes a channel region, the source electrode partially overlaps a source region of the semiconductor layer and is branched from a source wiring, and the drain electrode partially overlaps a drain region of the semiconductor layer and is connected to the transmissive electrode.

Still preferably, the reflective electrode forming step in a method for manufacturing an element-side substrate according to the present invention includes the steps of: forming a contact hole in the insulation film, the contact hole reaching the transparent electrode; film-forming a metal material of the reflective electrode so as to fill the contact hole; pattern-forming a resist so as to expose in the contact hole only a transmissive region of the transmissive electrode; and etching away the reflective electrode corresponding to the transmissive region using the resist.

Still preferably, the plasma treatment step in a method for manufacturing an element-side substrate according to the present invention is performed after the step of film-forming a metal material in the reflective electrode forming step, or is performed after the step of etching-away in the reflective electrode forming step. This plasma treatment step performs a plasma treatment in a reactive ion etching mode or a plasma etching mode under a plasma condition that a gas flow ratio (fluorine-based gas/oxygen) is 500 [sccm]/0 [sccm] to 150 [sccm]/350 [sccm], a power is 1500 [W], a pressure is 80 [mTorr], and a treatment time is 5 [s] to 30 [s].

Still preferably, the metal material of the reflective electrode in a method for manufacturing an element-side substrate according to the present invention is aluminum or a metal material including the aluminum, and the plasma treatment uses a fluorine-based gas.

Still preferably, the fluorine-based gas in a method for manufacturing an element-side substrate according to the present invention is $CF_4$ or $SF_6$.

Still preferably, the plasma treatment in a method for manufacturing an element-side substrate according to the present invention is performed after optimizing the plasma condition such that the reflectivity of a surface of the metal material of the reflective electrode is not degraded.

A method for manufacturing a semi-transmissive reflective liquid crystal display apparatus according to the present invention is provided, wherein an element-side substrate manufactured by the method for manufacturing an element-side substrate according to the present invention and an opposing-side substrate are arranged at a predetermined interval so as to oppose each other, the opposing-side substrate includes an opposing electrode formed thereon so as to oppose a pixel electrode including a reflective electrode and a transmissive electrode on the element-side substrate, and a liquid crystal is enclosed in a gap between the substrates so as to manufacture the semi-transmissive reflective liquid crystal display apparatus, thereby the objective described above being achieved.

With the structures described above, hereinafter, the functions of the present invention will be described.

According to the present invention, a metal material is subject to a plasma treatment, so that the work function of the metal material is controlled by changing by at least a predetermined value. Using this metal material for one of two types of metal thin films allows the elimination or the reduction in the difference of the work functions in the different metal thin films. Further, using this metal material for a reflective electrode of a semi-transmissive reflective liquid crystal display apparatus allows the elimination or the reduction in the difference of the work functions in the reflective electrode and a transparent electrode. Thus, it is possible to obtain an excellent image quality with no display flicker, without increasing the number of the manufacturing steps or deteriorating the optical performance of the liquid crystal display apparatus, unlike conventional liquid crystal display apparatuses.

By performing the plasma treatment on a metal electrode material, which becomes the reflective electrode, it is possible to control the value of the work function of the reflective electrode to be within a range of 0.1 eV or more to 0.6 eV or less, or to be within a range of 0.1 eV or more to 1.0 eV or less from the original value of the work function of the reflective electrode. When the work function changes by a value of 0.1 eV or more from the original value of the work function, it is possible to reduce the difference of the work functions in different metal thin films accordingly. As a result, an effect of improving an image quality can be obtained. In addition, changing the work function by a value of 1.0 eV or more from the original value of the work function is limited.

For example, in a semi-transmissive reflective liquid crystal display apparatus, a pixel electrode having a reflective electrode and a transmissive electrode is provided on an element-side substrate. Light which is externally incident and reflected by the reflective electrode and light which is emitted from a backlight and transmitted through the transparent electrode are irradiated onto a liquid crystal layer. In accordance with a voltage applied between the pixel electrode and an opposing electrode, a liquid crystal portion (pixel) interposed between both electrodes is placed in a dark state or a light state.

When the metal material and a thin-film device using the metal material according to the present invention are applied to the semi-transmissive reflective liquid crystal display apparatus, the work function of the uppermost layer of the reflective electrode is controlled by a plasma treatment so as to be within a difference of ±0.2 eV with respect to the work function of the transmissive electrode. Thus, the difference between the optimum direct current offset voltage for the reflective electrode and the optimum direct current offset voltage for the transmissive electrode is reduced, thereby obtaining an excellent image quality. The reflective electrode and the transparent electrode each can be a single layer film or can be a laminated layer film.

Aluminum (Al) or a material including aluminum (aluminum alloy or the like) can be used for the reflective electrode or the uppermost layer of the reflective electrode, the work function of which is controlled by the plasma treatment. When the reflective electrode is a laminated layer film, it is possible, by forming a metal layer with a high melting temperature made of, such as molybdenum (Mo), as a lower layer, to prevent an electrical corrosion in an Al film and an ITO film due to resist developing solution, etching solution or the like. The plasma treatment can be performed using a fluorine-based gas, such as $CF_4$.

As described above, according to the present invention, by performing a plasma treatment on a metal material, it is possible to control the work function of the metal material by changing at least a predetermined value (a range within 0.1 eV or more and 0.6 eV or less, or a range within 0.1 eV or more and 1.0 eV or less). This allows the elimination or the reduction in the difference of the work functions in different metal thin films in a thin-film device. When this is applied to the semi-transmissive reflective liquid crystal display apparatus, the difference of the work functions in a reflective electrode and a transparent electrode can be eliminated or reduced. As a result, the difference between the optimum direct current offset voltage for the reflective electrode and the optimum direct current offset voltage for the transmissive electrode is eliminated or reduced, thereby manufacturing a liquid crystal display apparatus having an excellent image quality with no display flicker. Further, since no unnecessary film is laminated on the reflective electrode as is in the conventional techniques, the problem of increasing the number of the manufacturing steps and deteriorating the optical performance of the liquid crystal display apparatus does not occur.

Figure 1:
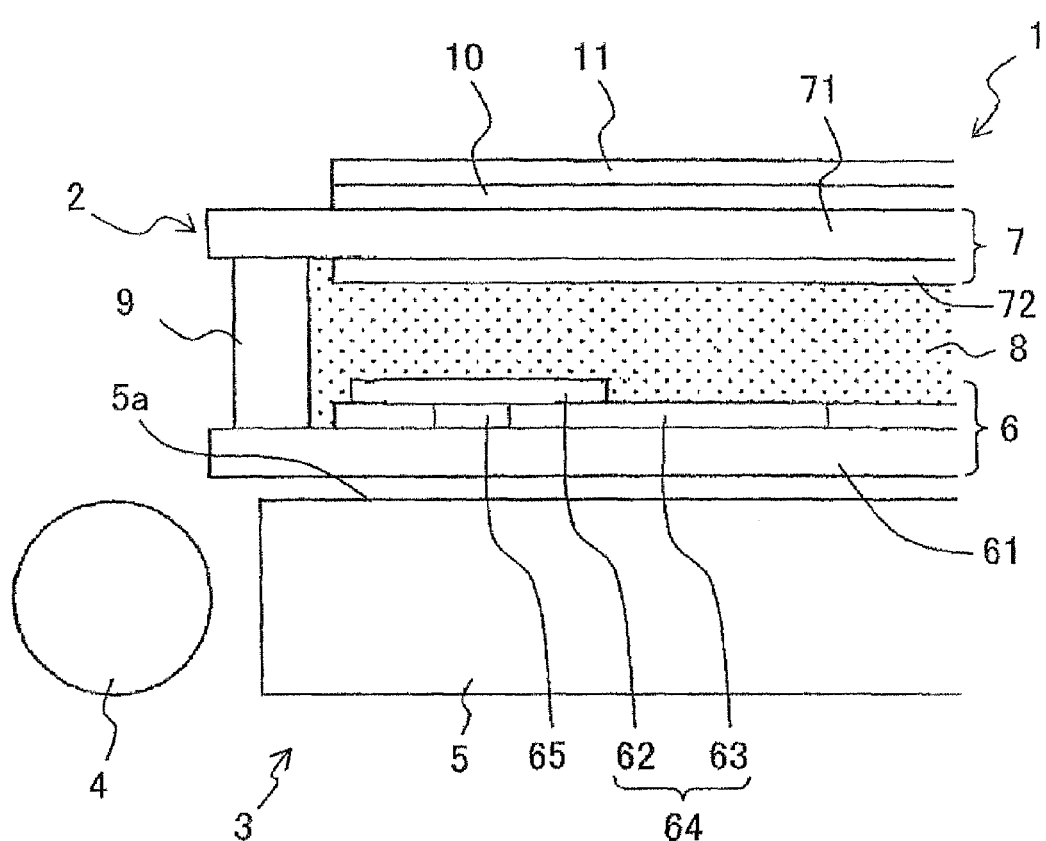
FIG. 1 is a cross-sectional view showing an exemplary structure of a semi-transmissive reflective liquid crystal display apparatus according to an embodiment of the present invention.
Figure 4:
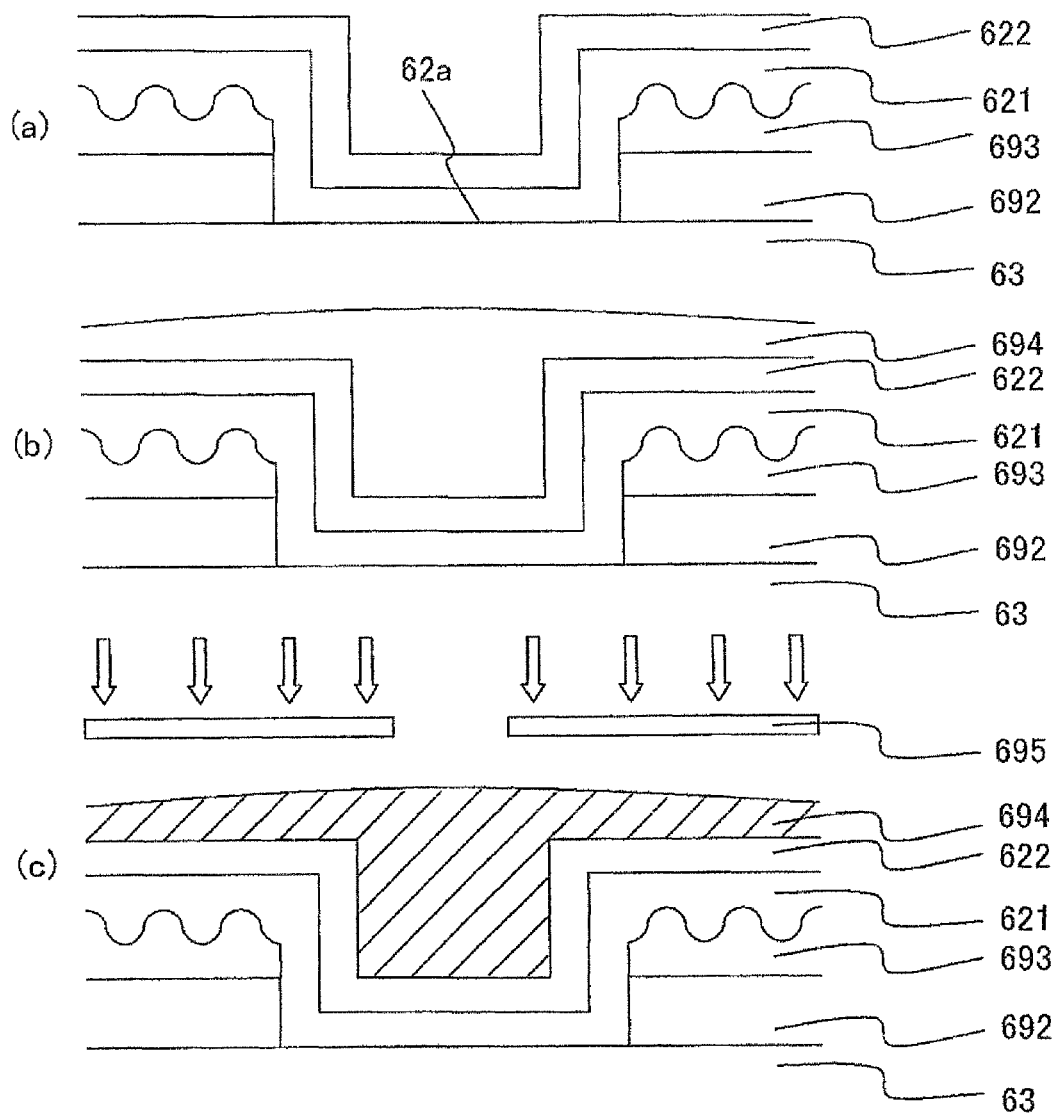

Portion (a) to Portion (c) of FIG. 4 are cross-sectional views for describing the step of forming (1) the reflective electrode of the element-side substrate in FIG. 1.

Figure 5:
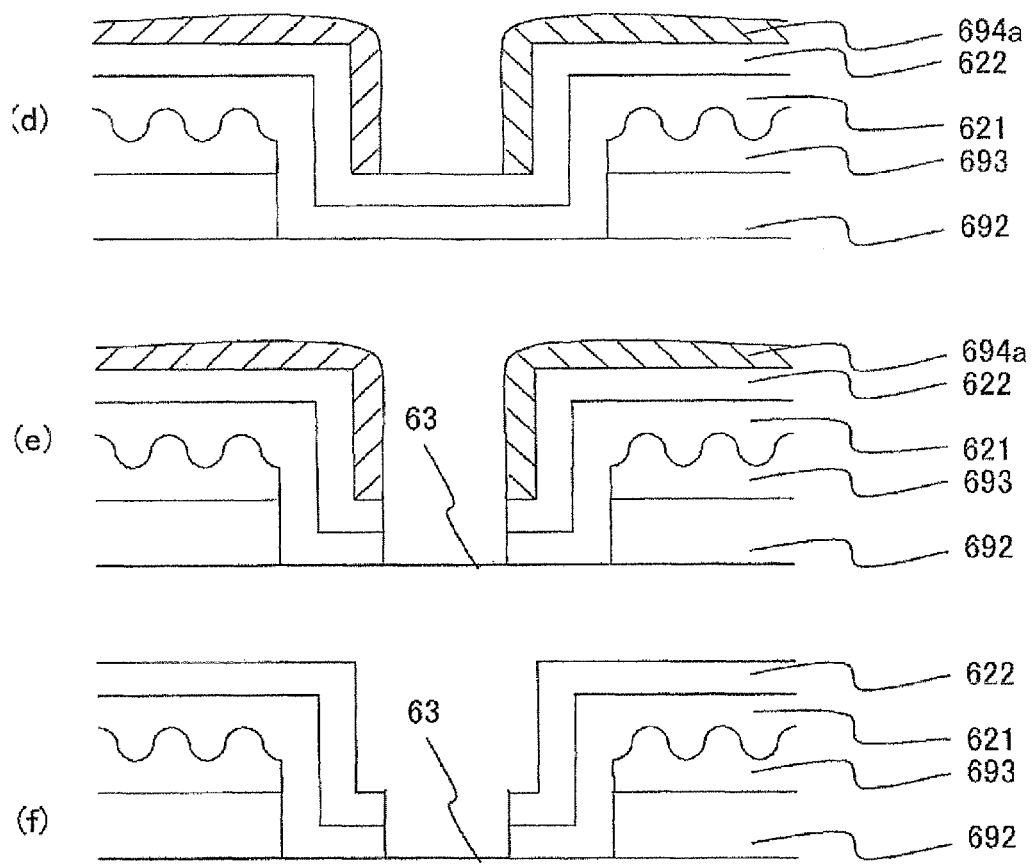

Portion (d) to Portion (f) of FIG. 5 are cross-sectional views for describing the step of forming (2) the reflective electrode of the element-side substrate in FIG. 1.

1 semi-transmissive reflective liquid crystal display apparatus
2 liquid crystal display panel
3 backlight
4 light source
5 light guide plate
6 element-side substrate
61, 71 glass substrate
62 reflective electrode
62a contact hole
621 Mo film
622 Al film
63 transmissive electrode
64 pixel electrode
65 semiconductor element (switching element)
66 source line
67 gate line
68 black matrix
691 gate insulation film
692 interlayer insulation film
693 concave-convex forming insulation film
694 resist
7 opposing substrate
72 opposing electrode
8 liquid crystal
9 sealing member
10 phase difference plate
11 polarization plate
D drain
G gate
S source

BEST MODE FOR CARRYING OUT THE INVENTION

Hereinafter, a case will be described in detail with reference to the accompanying drawings, in which an embodiment of a metal material according to the present invention having the work function thereof controlled by changing by at least a predetermined value by a plasma treatment and a method for manufacturing the metal material; and a thin-film device using the metal material for a metal thin film material and a method for manufacturing the thin-film device is applied to an element-side substrate, a semi-transmissive reflective liquid crystal display apparatus using a method for manufacturing the element-side substrate, and a method for the semi-transmissive reflective liquid crystal display apparatus.

FIG. 1 is a cross-sectional view showing an exemplary structure of a semi-transmissive reflective liquid crystal display apparatus 1 according to an embodiment of the present invention.

In FIG. 1, the semi-transmissive reflective liquid crystal display apparatus 1 has a backlight 3 arranged on the back side of a liquid crystal display panel 2. The backlight 3 includes a light source 4 and a light guide plate 5 having an end face thereof opposing the light source 4. The light emitted from the light source 4 is incident onto the light guide plate 5 from the end face of the light guide plate 5 and propagates inside the light guide plate 5. The light which exceeds the critical angle is emitted from an emission face 5*a* (in an upper direction in FIG. 1), and the light is irradiated from the back side of the liquid crystal display panel 2.

In the liquid crystal display panel 2, an element-side substrate 6 and an opposing substrate 7 are disposed at a predetermined interval therebetween so as to oppose each other. The surrounding of the liquid crystal panel 2 is sealed using a sealing member 9 while a liquid crystal 8 is enclosed in the gap between the substrates 6 and 7.

The element-side substrate 6 includes a plurality of pixel sections arranged on a glass substrate 61 in a matrix. Each pixel section includes a pixel electrode 64 including a reflective electrode 62 and a transmissive electrode 63. Each pixel electrode 64 is connected to a respective semiconductor element 65 (e.g., TFT) as a switching element for selectively driving each pixel section. The reflective electrode 62 and the transmissive electrode 63 are a thin-film device having two types of metal films provided thereon adjacent to each other. The work function of the reflective electrode 62 is controlled so as to be increased by a predetermined value (0.5 eV) by a plasma treatment, and thus the work functions of the reflective electrode 62 and the transmissive electrode 63 are controlled to be within a difference of ±0.2 eV. As a result, the difference between the optimum direct current offset voltage for the reflective electrode 62 and the optimum direct current offset voltage for the transmissive electrode 63 is reduced, thereby obtaining an excellent image quality with no display flicker.

The opposing substrate 7 has an opposing electrode 72 formed on a glass substrate 71, which opposes the pixel electrode 64 of the element-side substrate 6. Orientation films (not shown) are provided on the surfaces of the pixel electrode 64 and the opposing electrode 72, respectively, in order to control the orientation state of the liquid crystal 8. The liquid crystal 8 has, for example, a twist orientation of 90 degrees. In addition, a phase difference plate 10 and a polarization plate 11 are provided on the upper side of the opposing substrate 7.

Figure 2:
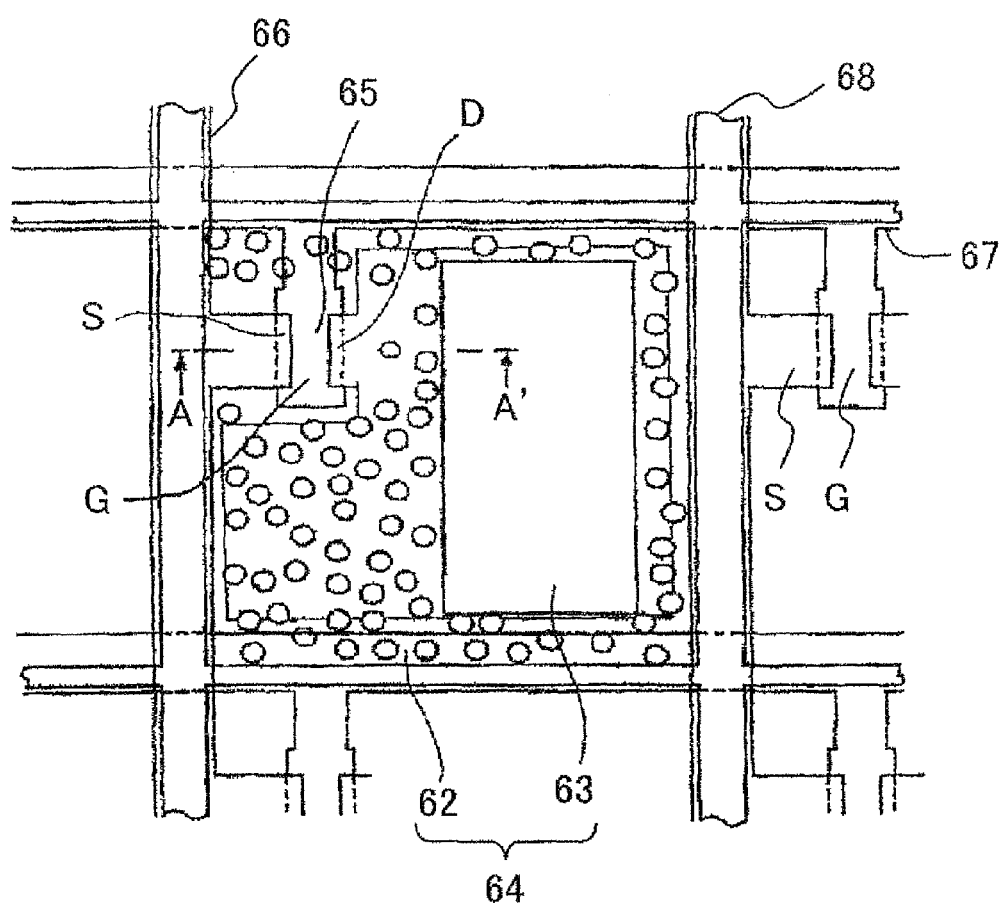
FIG. 2 is a plane view showing a structural example of one pixel in the liquid crystal display panel 2 in FIG. 1.

FIG. 2 is a plane view showing a structural example of one pixel in the liquid crystal display panel 2 in FIG. 1.

In FIG. 2, in the element-side substrate 6, a plurality of source lines (image signal lines) 66 and a plurality of gate lines (scan signal lines) 67 are formed on the glass substrate 61 so as to cross (at right angles) each other, and they are connected to respective drivers (not shown). The semiconductor element 65 is formed at a position in the vicinity of an intersection section of the source line 66 and the gate line 67. A source region S of the semiconductor element 65 is connected to the source line 66, and a gate G of the semiconductor element 65 is connected to the gate line 67. In addition, a drain region D of the semiconductor element 65 is connected to the pixel electrode 64, and the drain region D is connected to a liquid crystal capacitance formed between the pixel electrode 64 and the opposing electrode 72.

The gate G of each semiconductor element 65 is supplied with a scan signal having a High level or a Low level from a gate driver (not shown) via the gate line 67. The source region S of each semiconductor element 65 is supplied with an image signal from a source driver (not shown) via the source line 66. When the potential of the gate G is turned to the High level (scan signal) the semiconductor element 65 becomes conductive, thereby the image signal being written on the liquid crystal capacitance via the pixel electrode 64.

A black matrix 68 is provided on the glass substrate 71 of the opposing substrate 7 so as to oppose the source line 66 and the gate line 67. The light between the pixel sections is shielded by the black matrix 68.

Figure 3:
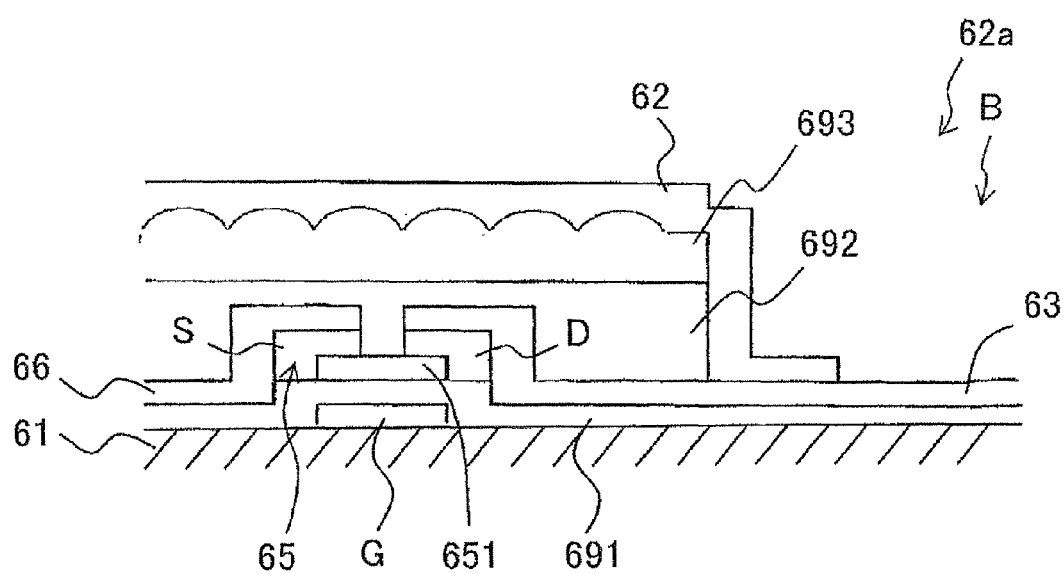
FIG. 3 is a longitudinal cross-sectional view of A-A' line in FIG. 2.

FIG. 3 is a longitudinal cross-sectional view of A-A' line in FIG. 2, and it shows a lamination structure of the semiconductor element 65 and the surrounding thereof.

In FIG. 3, the gate line 67 made of tantalum (Ta) having a film thickness of about 3000 Å and the gate G branched therefrom are formed on the glass substrate 61. A gate insulation film 691 made of silicon nitride (SiNx) having a film thickness of about 4100 Å is formed on the gate line 67 and the gate G.

A semiconductor layer 651, which is a channel region of the semiconductor element 65, is made of P-type silicon (Si) having a film thickness of about 1500 Å, and is formed via the gate insulation film 691 so as to correspond to the gate G.

The source region S and the drain region D of the semiconductor element 65 are made of n+ layers having a film thickness of about 500 Å, respectively, and portions thereof are formed on the semiconductor layer 651 with a gap therebetween. A source electrode (source region S) connected to the source line 66 is formed on the source region S of the semiconductor element 65. A drain electrode (drain region D) connected to the transmissive electrode 63 is formed on the drain region D of the semiconductor element 65.

The source electrode (source region S), the drain electrode (drain region D) and the transmissive electrode 63 are simultaneously formed with Ta/ITO having a film thickness of about 4500 Å. An interlayer insulation film 692 made of an SiNx layer having a film thickness of about 3000 Å is formed on the source electrode (source region S), the drain electrode (drain region D) and the transmissive electrode 63.

A concave-convex forming insulation film 693 having the surface thereof concave-convex made of an organic film layer having a thickness of about 3 μm is formed on the interlayer insulation film 692. The reflective electrode 62 made of aluminum (Al) having a film thickness of 500 Å to 1500 Å is formed on a portion of concave-convex forming insulation film 693. The reflective electrode 62 is conductive with the transmissive electrode 63 via a contact hole 62*a*, which will be described later. In addition, an Mo layer (not shown) is provided as a lower layer of the Al layer of the reflective electrode 62.

Hereinafter, a step of forming the reflective electrode 62 in the liquid crystal display panel 2 of the liquid crystal display apparatus 1 according to the present embodiment will be described in detail.

Portion (a) to Portion (c) of FIG. 4 and Portion (d) to Portion (f) of FIG. 5 are cross-sectional views for describing the step of forming the reflective electrode 62 of the element-side substrate 6 in FIG. 1.

In a film-forming step shown in Portion (*a*) of FIG. 4, a reflective electrode material, which becomes the reflective electrode 62, is film-formed on the concave-convex forming insulation film 693. In the present embodiment, an Mo film 621 having a film thickness of 500 Å to 1000 Å is formed, and an Al film 622 is film-formed thereon as a reflective film using a DC magnetron sputtering apparatus.

The contact hole 62*a* is formed in advance so as to penetrate through the concave-convex forming insulation film 693 and the interlayer insulation film 692 by etching and the like. The Al film 622 and the Mo film 621 are film-formed on the transmissive electrode 63 via the contact hole 62*a* so that the reflective electrode 62 and the transmissive electrode 63 are conductive with each other via the contact hole 62*a*.

The Mo film 621 is formed as an electrical corrosion prevention film such that the Al film 622 and the ITO film 63 are not electrically corroded by a resist developing solution, etching solution or the like in the next step. Alternatively, other metal layers having a high melting temperature can be formed.

In a resist application step shown in Portion (b) of FIG. 4, a resist 694 is applied on the Al film 622. In the present embodiment, a material including a novolac resin is applied as the resist 694 so as to have a thickness of about 2.0 µm to 2.4 µm.

In an exposure step shown in Portion (c) of FIG. 4, light is irradiated onto the resist 694 via a reticle 695 having a predetermined pattern formed thereon. As such, when the resist 694 is positive, a portion where the resist 694 is to be removed is exposed to light in order to form a transmissive portion, as shown by arrow B in FIG. 3. When the resist 694 is negative, a portion where the resist 694 is to remain is exposed to light.

In a developing step shown in Portion (d) of FIG. 5, the unprocessed substrate is immersed in the developing solution, and the exposed portion (positive) or the unexposed portion (negative) of the resist 694 is removed. As a result, a resist 694a is left. In the present embodiment, an alkali solution including 2.38% of tetramethylammonium hydroxide (TMAH) is used as the developing solution. Therefore, it is possible to form a resist pattern and to etch the Al film 622 with high precision.

In an etching step shown in Portion (e) of FIG. 5, the Mo film 621 (electrical corrosion prevention film) is immersed and etched in an etching solution. In the present embodiment, a mixed solution of phosphoric acid having a concentration of 50 wt % to 80 wt %, nitric acid concentration 0.5 wt % to 10 wt %, acetic acid having a concentration of 10 wt % or less and water is used as the etching solution. In the case of the phosphoric acid having less than a concentration of 50 wt %, the speed of etching the Mo film 621 is reduced, thus increasing the number of the steps. In addition, in the case of the phosphoric acid having more than a concentration of 80 wt %, the speed of etching the Mo film 621 is increased, thus making it difficult to control the line width. Furthermore, in the case of the nitric acid having less than a concentration of 0.5 wt %, the speed of etching the Mo film 621 is reduced, thus increasing the number of the steps.

In a resist removal step shown in Portion (f) of FIG. 5, the unprocessed substrate is immersed in a predetermined alkaline removal solution, and the resist 694a is removed. As a result, the reflective electrodes 62 having the surface thereof made of Al and the transmissive electrodes 63 having a transmissive portion B thereof exposed are formed in an alternate manner.

Herein, the transmissive electrode 63 and the drain electrode are formed in an integrated manner. Alternatively, the transmissive electrode 63 which becomes conductive with the drain electrode via the contact hole can be formed on the concave-convex forming electrode 693.

Next, the plasma treatment is performed on the unprocessed substrate. In the present embodiment, the plasma treatment is performed in a REACTIVE ION ETCHING MODE under the plasma condition that the gas flow ratio $CF_4/O_2$ is 500 [sccm]/0 [sccm] to 150 [sccm]/350 [sccm], the power is 1500 [W], the pressure is 80 [mTorr], and the treatment time is 5 [s] to 30 [s].

The plasma treatment can be performed after the Al film 622 is film-formed, as shown in Portion (a) of FIG. 4. In the present embodiment, the plasma treatment is performed using $CF_4$. Alternatively, it is considered that using a gas including fluorine (fluorine-based gas), such as $SF_6$ and the like, can obtain a similar effect. In addition, a gas including $O_2$ can be used for the plasma treatment. Either a PLASMA ETCHING (hereinafter, P.E.) MODE or a REACTIVE ION ETCHING (hereinafter, R.I.E) MODE can be used for the plasma treatment. However, the R.I.E. is preferably used since it can change the work function in a greater manner.

In the semi-transmissive reflective liquid crystal display apparatus 1 according to the present embodiment fabricated in this manner, a display voltage in accordance with an image signal is applied between the pixel electrode 64 and the opposing electrode 72 of each pixel section, and the orientation state of the liquid crystal 8 changes.

External light incident upon the liquid crystal display panel 2 from the opposing substrate 7 side is reflected by the reflective electrode 62, and the light having a light amount in accordance with the orientation state of the liquid crystal 8 is emitted from the opposing substrate 7 side. As a result, an image can be viewed. In addition, when the backlight 3 is lit on, light is incident upon the liquid crystal display panel 2 from the element-side substrate 6 side. The incident light is transmitted through the transmissive electrode 63, and the light having a light amount in accordance with the orientation state of the liquid crystal 8 is emitted from the opposing substrate 7 side. As a result, an image can be viewed.

Furthermore, in the semi-transmissive reflective liquid crystal display apparatus 1 according to the present embodiment, the reflective electrode 62 and the transmissive electrode 63 are made of the Al film and the ITO film, respectively. The value of the work function of aluminum (Al) (metal material) is about 4.2 eV to 4.3 eV. The work function of Al is controlled by the plasma treatment so as to have 4.5 eV to 4.7 eV. As such, the work function of Al is controlled so as to reduce the difference with and be made approximately equal to the work function of ITO in order to be within a difference of ±0.2 eV with respect to the work function 4.7 eV to 5.2 eV of ITO. As a result, the difference between the optimum direct current offset voltage for the reflective electrode 62 and the optimum direct current offset voltage for the transmissive electrode 63 is about 0.1V.

In contrast, in the conventional semi-transmissive reflective liquid crystal display apparatus, Al (metal material) which is not subject to the plasma treatment is used. Thus, the value of the work function of Al is about 4.2 eV to 4.3 eV. As a result, the difference between the optimum direct current offset voltage for the reflective electrode 62 and the optimum direct current offset voltage for the transmissive electrode 63 is about 0.5V.

Therefore, according to the present embodiment, in the semi-transmissive reflective liquid crystal display apparatus 1 including the reflective electrode 62 and the transmissive electrode 63 in the pixel electrode 64, the difference of the work functions in different metal thin films is reduced. The surface of the reflective electrode 62 is subject to the plasma treatment, so that the work function of the reflective electrode 62 is controlled by changing by a value of 0.1 eV or more to 1.0 eV or less from the original value. Thus, it is possible to place the work function of the reflective electrode 62 within a difference of ±0.2 eV (or −0.2 eV to +0.2 eV) with respect to the work function of the transmissive electrode 63. As a result, no extra manufacturing step is required as is conventionally required. Even if the optimum direct current offset voltage for one of the reflective electrode 62 and the transmissive electrode 63 is applied, it is possible to reduce the deterioration of an image display quality resulting from the difference with the optimum direct current offset voltage for the other electrode. As such, it is possible to improve the display quality of the liquid crystal display apparatus 1. In addition, since a large direct current voltage component is not applied to the other electrode for a long time, it is possible to improve the reliability of the liquid crystal 8. Further, since no unnecessary film is laminated on the reflective electrode as is in the conventional techniques, the problem of increasing the number of the manufacturing steps and deteriorating the optical performance of the liquid crystal display apparatus does not occur.

In the embodiment described above, Al is used for the reflective electrode 62. Alternatively, a material including Al (Al alloy or the like) can be used for the reflective electrode 62. In addition, the reflective film 62 can be a laminated layer film or can be a single layer film as long as the uppermost layer of the reflective electrode 62 is made of Al or the material including Al. Further, ITO is used for the transmissive electrode 63. Alternatively, indium oxide, zinc oxide, tin oxide, indium zinc oxide or the like can be used for the transmissive electrode 63.

The embodiment has described the case in which for the thin-film device which is applied to the element-side substrate of the semi-transmissive reflective liquid crystal display apparatus according to the present invention, the one (Al film of the reflective electrode 62) of the two types of the metal films is provided on a portion (or entirety) of the other (ITO film of the transmissive electrode 63) of the two types of the metal films via the insulation film (interlayer insulation film 692 and concave-convex forming insulation film 693); a portion of the one (Al film of the reflective electrode 62) of the two types of the metal films is connected to the ITO film through the contact hole 62a; and the regions of the ITO film and the Al film in each pixel are adjacent to each other in a plane view. In addition, in the step of forming the one of the two types of the metal films (Al film of the reflective electrode 62) in the method for manufacturing the thin-film device, it has been described that the one (Al film of the reflective electrode 62) of the two types of the metal films is formed on a portion (or entirety) of the other (ITO film of the transmissive electrode 63) of the two types of the metal films via the insulation film; a portion of the one (Al film of the reflective electrode 62) of the two types of the metal films is connected to the ITO film through the contact hole 62a; and the regions of the ITO film and the Al film in each pixel are adjacent to each other in the plane view. However, the present invention is not limited to this thin-film device or method for manufacturing the thin-film device. A thin-film device according to the present invention only has to be that at least two types of metal films are provided so as to be adjacent to each other in a plane view; and the work function of at least one of the two types of the metal films is controlled by changing by at least a predetermined value by a plasma treatment so that the work functions of the two types of the metal films are changed to be the same or the difference thereof is reduced. In addition, a method for manufacturing the thin-film device according to the present invention only has to include: a step of forming the other of two types of metal films; a step of forming one of the two types of the metal films; and a step of performing a plasma treatment on one of the two types of the metal films so that the work functions of the one metal film and the other metal film are controlled to the same or that the difference thereof is reduced. In other words, the one metal film and the other metal film only have to be arranged so as to be adjacent to each other in a plane view; and at least one of the two types of metal films are subject to a plasma treatment so that the work functions of the one metal film and the other metal film are controlled to be the same or that the difference thereof is reduced. In this case, the work function of the metal material for the metal film subject to a plasma treatment only has to be controlled by changing by at least a predetermined value by the plasma treatment. In the method for manufacturing the metal material, the plasma treatment is performed using a fluorine-based gas. The predetermined value is 0.1 eV and the value of the work function is controlled to be within a range of 0.1 eV or more and 1 eV or less. Alternatively, the predetermined value is 0.1 eV and the value of the work function is controlled to be within a range of 0.1 eV or more and 0.6 eV or less. For a metal material for a metal film subject to a plasma treatment, the metal material made of Al or a material including Al is subject to the plasma treatment, and the work function of the metal material is changed.

Accordingly, the present invention can provide: a metal material having the work function thereof controlled by changing by at least a predetermined value from the original value and a method for manufacturing the metal material; a thin-film device capable of eliminating or reducing the difference of the work functions in different metal thin films using the metal material and a method for manufacturing the thin-film device; an element-side substrate capable of obtaining an excellent image quality without causing the increase of the manufacturing steps or the deterioration of the optical performance using the thin-film device and a method for manufacturing the element-side substrate; and a semi-transmissive reflective liquid crystal display apparatus using the element-side substrate and a method for manufacturing the semi-transmissive reflective liquid crystal display apparatus.

As described above, the present invention is exemplified by the use of its preferred embodiment(s). However, the present invention should not be interpreted solely based on the embodiment(s) described above. It is understood that the scope of the present invention should be interpreted solely based on the claims. It is also understood that those skilled in the art can implement equivalent scope of technology, based on the description of the present invention and common knowledge from the description of the detailed preferred embodiment(s) of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in a field of: a metal material and a method for manufacturing the metal material; a thin-film device using the metal material for a metal thin film material and a method for manufacturing the thin-film device; an element-side substrate including a reflective section for producing a reflective display using surrounding light as an illumination, the reflective section including the metal material for a reflective metal electrode, and a transmissive section for producing a transmissive display using backlight as an illumination in one pixel and a method for manufacturing the element-side substrate; a semi-transmissive reflective liquid crystal display apparatus using the element-side substrate and a method for manufacturing the semi-transmissive reflective liquid crystal display apparatus; and an electronic information device (e.g., a cell phone, a PDA, a laptop personal computer and the like) using the semi-transmissive reflective liquid crystal display apparatus for a display section thereof, by performing a plasma treatment on a metal electrode material layer, which becomes a reflective electrode, to control the work function of the reflective electrode by changing by at least a predetermined value (0.1 eV) from the original value so as to be within a difference of 0.2 eV with respect to the work function of a transmissive electrode, it is possible to reduce as much as possible the difference between the optimum direct current offset voltage for the reflective electrode and the optimum direct current offset voltage for the transmissive electrode, thereby obtaining an excellent image quality. In addition, no unnecessary film is laminated on the reflective electrode, and it is possible to prevent the increase of the number of the manufacturing steps and the deterioration of the optical performance and also possible to manufacture the liquid crystal display apparatus having an excellent image quality.

The invention claimed is:

1. A method for manufacturing an element-side substrate, the element-side substrate comprising a plurality of pixel electrodes and switching elements for selectively driving the pixel electrodes arranged thereon in two dimensions, the pixel electrode including a reflective electrode for reflecting light and a transmissive electrode for passing the light, the method comprising:

a switching element forming step of forming a switching element on a substrate;

an insulation film forming step of forming an insulation film on the switching element and on the transmissive electrode connected to a drain electrode of the switching element;

a reflective electrode forming step of forming the reflective electrode on the insulation film; and a plasma treatment step of controlling a work function of the reflective electrode by changing the work function of the reflective electrode by at least a predetermined value by performing a plasma treatment on the reflective electrode using a fluorine-based gas.

2. A method for manufacturing an element-side substrate according to claim 1, wherein the switching element forming step comprises:

forming a gate wiring and a gate electrode branched therefrom on the substrate;

forming a gate insulation film on the gate electrode;

forming a semiconductor layer on the gate insulation film so as to correspond to the gate electrode; and forming a source electrode and a drain electrode with a gap therebetween on the semiconductor layer, and forming the transmissive electrode, wherein the semiconductor layer becomes a channel region, the source electrode partially overlaps a source region of the semiconductor layer and is branched from a source wiring, and the drain electrode partially overlaps a drain region of the semiconductor layer and is connected to the transmissive electrode.

3. A method for manufacturing an element-side substrate according to claim 1, wherein the reflective electrode forming step comprises:

forming a contact hole in the insulation film, the contact hole reaching the transparent electrode;

film-forming a metal material of the reflective electrode so as to fill the contact hole;

pattern-forming a resist so as to expose in the contact hole only a transmissive region of the transmissive electrode; and etching away the reflective electrode corresponding to the transmissive region using the resist.

4. A method for manufacturing an element-side substrate according to claim 3, wherein the plasma treatment step is performed after the step of film-forming a metal material in the reflective electrode forming step, or is performed after the step of etching-away in the reflective electrode forming step.

5. A method for manufacturing an element-side substrate according to claim 1, wherein the plasma treatment step performs a plasma treatment in a reactive ion etching mode or a plasma etching mode under a plasma condition that a gas flow ratio (fluorine-based gas/oxygen) is 500 [sccm]/0 [sccm] to 150 [sccm]/350 [sccm], a power is 1500 [W], a pressure is 80 [mTorr], and a treatment time is 5 [s] to 30 [s].

6. A method for manufacturing an element-side substrate according to claim 2, wherein the metal material of the reflective electrode is aluminum or a metal material including the aluminum.

7. A method for manufacturing an element-side substrate according to claim 5, wherein the fluorine-based gas is $CF_4$ or $SF_6$.

8. A method for manufacturing an element-side substrate according to claim 6, wherein the fluorine-based gas is $CF_4$ or $SF_6$.

9. A method for manufacturing an element-side substrate according to claim 5, wherein the plasma treatment is performed after optimizing the plasma condition such that the reflectivity of a surface of the metal material of the reflective electrode is not degraded.

10. A method for manufacturing a semi-transmissive reflective liquid crystal display apparatus, wherein an element-side substrate manufactured by a method for manufacturing an element-side substrate according to claim 1 and an opposing-side substrate are arranged at a predetermined interval so as to oppose each other, the opposing-side substrate includes an opposing electrode formed thereon so as to oppose a pixel electrode including a reflective electrode and a transmissive electrode on the element-side substrate, and a liquid crystal is enclosed in a gap between the substrates so as to manufacture the semi-transmissive reflective liquid crystal display apparatus.

11. A method for manufacturing an element-side substrate according to claim 5, wherein there is no transparent electrode material formed on the reflective electrode.

12. A method for manufacturing an element-side substrate according to claim 5, wherein the reflective electrode is a single layer.

* * * * *